(12) United States Patent
Kang et al.

(10) Patent No.: US 12,213,247 B2
(45) Date of Patent: Jan. 28, 2025

(54) ELECTRONIC DEVICE

(71) Applicant: Advanced Semiconductor Engineering, Inc., Kaohsiung (TW)

(72) Inventors: Jung Jui Kang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 209 days.

(21) Appl. No.: 17/865,380

(22) Filed: Jul. 14, 2022

(65) Prior Publication Data

US 2024/0023239 A1 Jan. 18, 2024

(51) Int. Cl.
*H05K 1/02* (2006.01)
*H05K 1/14* (2006.01)

(52) U.S. Cl.
CPC .......... *H05K 1/0296* (2013.01); *H05K 1/144* (2013.01); *H05K 1/145* (2013.01); *H05K 2201/042* (2013.01); *H05K 2201/10159* (2013.01); *H05K 2201/10378* (2013.01)

(58) Field of Classification Search
CPC ...... H05K 1/0296; H05K 1/144; H05K 1/145; H05K 2201/042; H05K 2201/10159; H05K 2201/10378
See application file for complete search history.

(56) References Cited

U.S. PATENT DOCUMENTS

| | | | |
|---|---|---|---|
| 9,595,514 B2 | 3/2017 | Bruno et al. | |
| 9,935,076 B1 | 4/2018 | Ramachandran et al. | |
| 10,748,870 B2 | 8/2020 | Yu et al. | |
| 11,004,783 B2 | 5/2021 | Calugaru | |
| 11,844,199 B2 | 12/2023 | Hung et al. | |
| 2002/0057554 A1 | 5/2002 | Dibene et al. | |
| 2004/0027802 A1 | 2/2004 | Duerbaum et al. | |
| 2006/0043581 A1 | 3/2006 | Prokofiev | |
| 2012/0112352 A1* | 5/2012 | Chi | H01L 23/481 257/784 |
| 2012/0293972 A1* | 11/2012 | Pan | H02M 3/003 361/772 |
| 2013/0003310 A1* | 1/2013 | Raj | H05K 7/1092 361/783 |
| 2016/0093588 A1* | 3/2016 | Wang | H01L 24/18 257/737 |
| 2020/0075553 A1 | 3/2020 | Delacruz et al. | |
| 2020/0312773 A1 | 10/2020 | Tsai et al. | |
| 2020/0373285 A1 | 11/2020 | Hovis et al. | |
| 2020/0381351 A1* | 12/2020 | Calugaru | G06F 1/183 |
| 2020/0381392 A1 | 12/2020 | Yu et al. | |

(Continued)

OTHER PUBLICATIONS

U.S. Appl. No. 17/585,416, filed Jan. 26, 2022.

(Continued)

*Primary Examiner* — Hoa C Nguyen

(74) *Attorney, Agent, or Firm* — FOLEY & LARDNER LLP

(57) ABSTRACT

An electronic device is disclosed. The electronic device includes a carrier, a computing element disposed over the carrier, and a first data storage element disposed over the carrier and electrically connected with the computing element through the carrier. The computing element is configured to receive a first power provided from the first data storage element.

20 Claims, 12 Drawing Sheets

(56) References Cited

U.S. PATENT DOCUMENTS

| | | | |
|---|---|---|---|
| 2021/0057367 A1 | 2/2021 | Signorini et al. | |
| 2021/0120675 A1* | 4/2021 | Clavette | H01L 25/16 |
| 2021/0151374 A1* | 5/2021 | Zou | H01L 25/16 |
| 2021/0175189 A1* | 6/2021 | Kung | H01L 21/6835 |
| 2021/0249384 A1 | 8/2021 | Kim et al. | |
| 2022/0028848 A1* | 1/2022 | Baek | H01L 23/5383 |
| 2022/0068782 A1* | 3/2022 | Cheah | H01L 23/49833 |
| 2022/0077109 A1* | 3/2022 | Chava | H01L 25/0657 |
| 2023/0140057 A1* | 5/2023 | Samarthyam | G06Q 10/02 |
| | | | 705/6 |

OTHER PUBLICATIONS

U.S. Appl. No. 17/669,231, filed Feb. 10, 2022.
Non-Final Office Action for U.S. Appl. No. 17/669,231, issued Jul. 17, 2024, 19 pages.
Notice of Allowance for U.S. Appl. No. 17/585,416, issued Aug. 2, 2023, 11 pages.

* cited by examiner

ELECTRONIC DEVICE

BACKGROUND

1. Field of the Disclosure

The present disclosure relates to an electronic device, and in particular to an electronic device having an electronic component and a power regulating device.

2. Description of the Related Art

System-in-Package (SiP) technology leverages integrated circuit (IC) assembly capabilities, including flip chip packaging, wafer level packaging, fan-out wafer level packaging, 2.5D/3D IC, etc., to integrate multiple chips or components into a package. Since different voltages are required for components in a package having multiple functions, a power regulating device may be used to provide the different types of power control.

The power routing path for a power regulating device is usually provided by a substrate and/or package routing features (such as conductive vias and pads) in the package. A long power routing path through the substrate can result in significant voltage drop and degrade performance. As the input voltage decreases, voltage drops may become an issue.

SUMMARY

In some embodiments, an electronic device includes a carrier, a computing element disposed over the carrier, and a first data storage element disposed over the carrier and electrically connected with the computing element through the carrier. The computing element is configured to receive a first power provided from the first data storage element.

In some embodiments, an electronic device includes a carrier having a first region and a second region. A circuit density in the first region is higher than that in the second region. The electronic device also includes a first component disposed over the carrier and a second component disposed over the carrier and communicated with the first component through the first region. The first component and the second component are collectively configured to provide a first power path passing through a backside surface of the first component and a backside surface of the second component.

In some embodiments, an electronic device includes an electronic component including a first lateral surface and a second lateral surface. The electronic device also includes a memory unit adjacent to the electronic component and a non-memory unit adjacent to the electronic component. The electronic component is configured to receive a first power from the memory unit and a second power from the non-memory unit.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
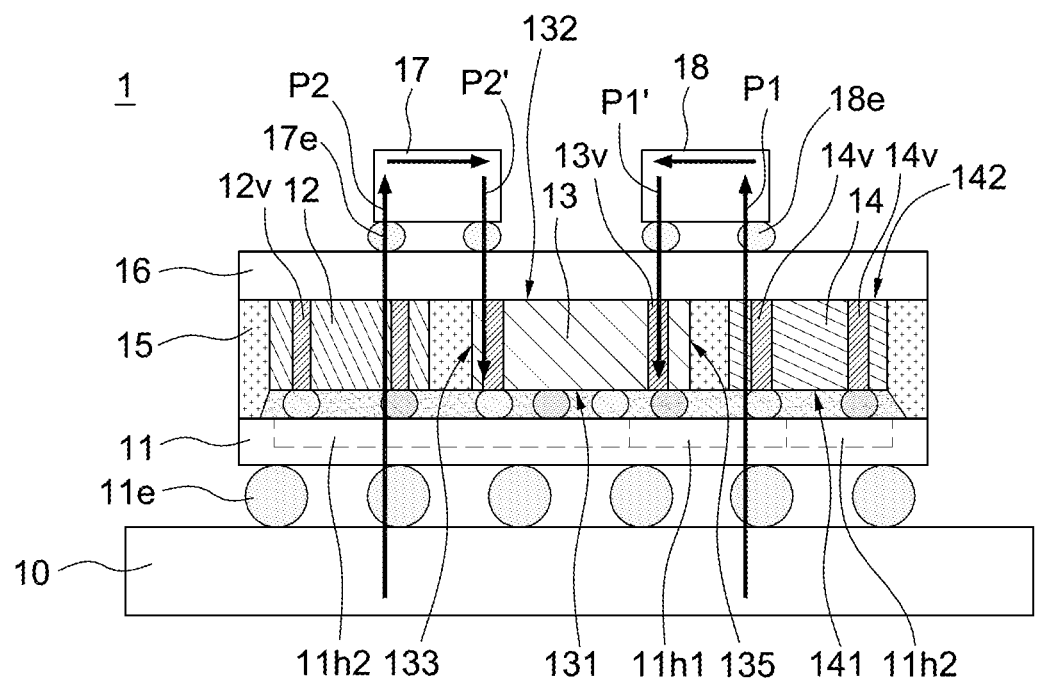
FIG. 1A illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of an example of an electronic device 1 according to some embodiments of the present disclosure. In some embodiments, the electronic device 1 may include a package, such as a semiconductor device package. In some embodiments, the electronic device 1 may include carriers 10, 11, 16, an interconnection structure 12, active components 13, 14, an encapsulant 15 and power regulating devices 17, 18.

The carrier 10 may include a substrate. In some embodiments, the carrier 10 may include, for example, a printed circuit board (PCB), such as a paper-based copper foil laminate, a composite copper foil laminate, or a polymer-impregnated glass-fiber-based copper foil laminate.

In some embodiments, the carrier 10 may provide power and/or ground connections to the devices or components electrically connected to the carrier 10. For example, the carrier 10 may have a connector or terminal configured to be electrically connected to a power source or a power supply (not illustrated in the figures). The carrier 10 may provide a power routing path (or a power path) between the power supply and the power regulating device (such as one of the power regulating devices 17 and 18), which in turn may provide regulated power to the active component (such as one of the active components 13, 14) in the electronic device 1.

The carrier 11 may be disposed on the carrier 10 and may be electrically connected with the carrier 10 through an electrical contact 11e. In some embodiments, the electrical contact 11e may include a reflowable conductive material, such as a solder material. In some embodiments, the electrical contact 11e may include one or more solder balls or solder bumps, such as a controlled collapse chip connection (C4) bump, a ball grid array (BGA) or a land grid array (LGA).

In some embodiments, the carriers 10, 11 and 16 may each include an interconnection structure, such as a redistribution layer (RDL) and/or a grounding element. The RDL may provide a fan-out horizontal electrical path for the devices or components electrically connected with the carriers 10, 11 and/or 16.

In some embodiments, the RDL may include regions or portions having different circuit densities, such as different numbers of components, input/output (I/O) pins and/or routings per unit area. For example, the carrier 11 may include a region 11h1 having a relatively higher circuit density and a region 11h2 having a relatively lower circuit density. In other words, the region 11h1 may be the highest circuit density region in the carrier 11. In other words, the region 11h1 may be the densest circuit region in the carrier 11. For example, the line width, the line spacing and/or the pad pitch in the region 11h1 may be relatively narrower than that of the region 11h2.

Figure 1B:
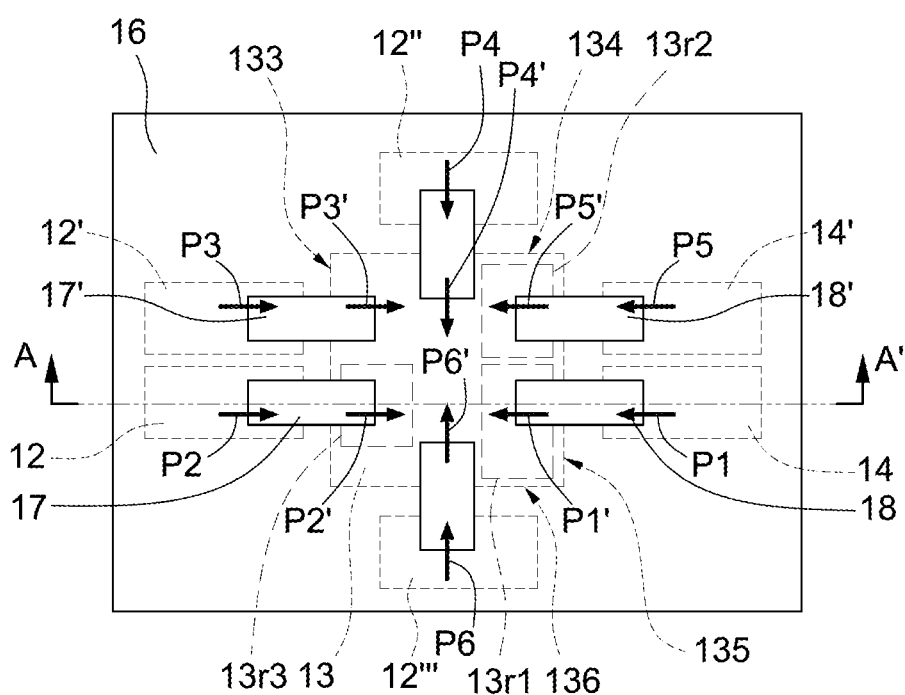
FIG. 1B illustrates a top view of an example of a part of an electronic device according to some embodiments of the present disclosure.
Figure 1B:
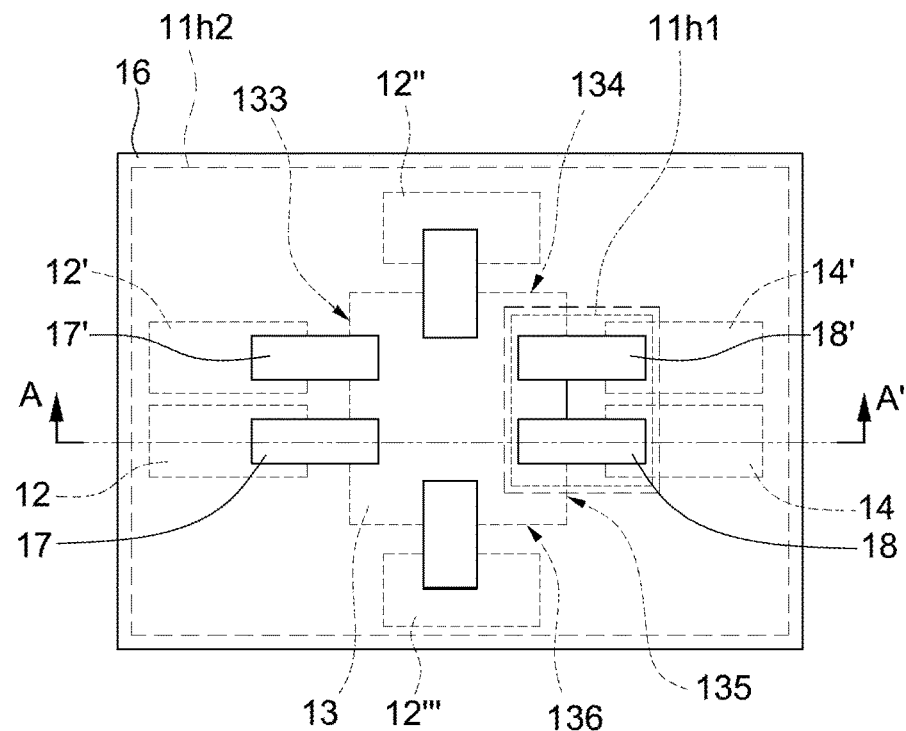

In some embodiments, the region 11h1 may be configured to provide, define, construct, or establish a signal routing path (or a signal path) between the active components 13 and 14. For example, the active components 13 and 14 may communicate through the region 11h1. In some embodiments, the region 11h2 may be configured to provide, define, construct, or establish a power path between the power supply and the power regulating device (such as one of the power regulating devices 17 and 18). In some embodiments, as shown in FIG. 1B', the region 11h1 may be surrounded or encircled by the region 11h2.

As used herein, a signal path may refer to a path through which an electrical signal may be transmitted. Such an electrical signal may include either analog or digital signals. Additionally, a power path may refer to a path dedicated to power supply connections.

The interconnection structure 12 may be disposed on the carrier 11. In some embodiments, the interconnection structure 12 may include a component or a connection configured to provide, define, construct, or establish a power path "P2" between the power regulating device 17 and the carrier 11.

In some embodiments, the interconnection structure 12 may include an interposer or include interposer-like wiring to form a structure which may be regarded as an interposer or a fan-out substrate. For example, the interconnection structure 12 may include a substrate and a conductive element 12v for providing electrical connections between the power regulating device 17 and the carrier 11. For example, the conductive element 12v may be configured to receive power from the carrier 11 and transmit the power to the power regulating device 17, as indicated by the power path P2. The conductive element 12v may be configured to transmit power from the carrier 11 to the power regulating device 17 without passing through the active component 13.

The conductive element 12v may penetrate the substrate of the interconnection structure 12. The conductive element 12v may include a conductive pillar, a conductive via (such as a through-silicon via (TSV)), a conductive trace, a conductive wire, or other feasible connectors. In some embodiments, the conductive element 12v may be electrically connected to the carrier 11 (such as with the RDL) through an electrical contact, such as solder balls. The substrate of the interconnection structure 12 may include, for example, silicon (Si), glass or other suitable materials. In some embodiments, the substrate of the interconnection structure 12 may be configured to support the conductive element 12v.

In some embodiments, a capacitor or a capacitance device may be integrated into the interconnection structure 12. For example, the capacitor may be adjacent to a surface of the substrate of the interconnection structure 12. For example, the capacitor may be adjacent to the power regulating device 17. In some embodiments, the capacitor may include a deep trench capacitor (DTC), a multi-layer ceramic capacitor (MHLCC), or other capacitors. In some embodiments, the capacitor may be present in (be a part of or construct a part of) the power path P2.

The active component 13 may be disposed on the carrier 11 and spaced apart from the interconnection structure 12. For example, the active component 13 may be physically separated from the interconnection structure 12. In some embodiments, the active component 13 may be electrically connected to the carrier 11 through an electrical contact, such as solder balls. In some embodiments, the active component 13 may be electrically connected with the carrier 11 by way of flip-chip or wire-bond techniques.

In some embodiments, the active component 13 may be or include circuits or circuit elements that rely on an external power supply to control or modify electrical signals. For example, the active component 13 may include a processor, a controller, a memory, or an input/output (I/O) buffer, etc. In some embodiments, the active component 13 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or other type of computing element or integrated circuit.

In some embodiments, the active component 13 may include a surface 131 facing the carrier 11, a surface 132 opposite to the surface 131, and one or more lateral surfaces (or sides) 133 and 135 extending between the surfaces 131 and 132. In some embodiments, the surface 131 may include an active surface and the surface 132 may include a backside surface.

In some embodiments, an electrical signal may be transmitted through the active surface (e.g., the surface 131). For example, a signal path may pass through the active surface (e.g., the surface 131). For example, the surface 131 may include a circuit region. The circuit region on the surface 131 may be configured to transmit a signal to the region 11$h$1 of the carrier 11 and/or to receive a signal from the region 11$h$1 of the carrier 11.

In some embodiments, a power (or a power signal) may pass along the lateral surface 133, as indicated by the power path P2. The power path P2 may not pass through the active component 13. In some embodiments, a power may pass along the lateral surface 135, as indicated by a power path "P1". The power path P1 may not pass through the active component 13.

In some embodiments, a power (or a power signal) may be transmitted through the backside surface (e.g., the surface 132). For example, a power may be provided to the backside surface (e.g., the surface 132). For example, one or more power paths "P1'" and "P2'" may pass through the backside surface (e.g., the surface 132).

In some embodiments, the active component 13 may include one or more conductive vias 13$v$. In some embodiments, the conductive via 13$v$ may extend between the surface 131 and the surface 132. In some embodiments, the conductive via 13$v$ may be electrically connected to the power regulating device (such as one of the power regulating devices 17 and 18). For example, the conductive via 13$v$ may be configured to receive power from the power regulating device 17 (as indicated by the power path P2') and the power regulating device 18 (as indicated by the power path P1').

The active component 14 may be disposed on the carrier 11 and spaced apart from the interconnection structure 12 and the active component 13. For example, the active component 14 may be physically separated from the interconnection structure 12 and the active component 13. In some embodiments, the active component 14 may be electrically connected to the carrier 11 through an electrical contact, such as solder balls. In some embodiments, the active component 14 may be electrically connected with the carrier 11 by way of flip-chip or wire-bond techniques.

In some embodiments, the active component 14 may be or include circuits or circuit elements that rely on an external power supply to control or modify electrical signals. For example, the active component 14 may include a processor, a controller, a memory, or an input/output (I/O) buffer, etc. In some embodiments, the active component 14 may include a data storage element. In some embodiments, the active component 14 may include a non-volatile memory (such as a flash memory and a read-only memory (ROM)) or a volatile memory (such as a Dynamic Random Access Memory (DRAM)). In some embodiments, the active component 14 may include a high bandwidth memory (HBM).

In some embodiments, the active component 14 may include a surface 141 facing the carrier 11 and a surface 142 opposite to the surface 141. In some embodiments, the surface 141 may include an active surface and the surface 142 may include a backside surface.

In some embodiments, an electrical signal may be transmitted through the active surface (e.g., the surface 141). For example, a signal path may pass through the active surface (e.g., the surface 141). For example, the surface 141 may include a circuit region. The circuit region on the surface 141 may be configured to transmit a signal to the region 11$h$1 of the carrier 11 and/or to receive a signal from the region 11$h$1 of the carrier 11.

In some embodiments, a power (or a power signal) may be transmitted through the active surface (e.g., the surface 141). For example, a power (or a power signal) may be provided to the active surface (e.g., the surface 141). For example, the power path P1 may pass through the active surface (e.g., the surface 141).

In some embodiments, the active component 14 may include one or more conductive vias 14$v$. In some embodiments, the conductive vias 14$v$ may extend between the surface 141 and the surface 142. In some embodiments, the conductive vias 14$v$ may be electrically connected to the power regulating device 18. For example, the conductive vias 14$v$ may be configured to receive power from the carrier 11 and transmit the power to the power regulating device 18, as indicated by the power path P1. The conductive vias 14$v$ may be configured to transmit power from the carrier 11 to the power regulating device 18 without passing through the active component 13.

In some embodiments, the active components 13 and 14 are face-down on the carrier 11. For example, the active surfaces (e.g., the surfaces 131 and 141) face the carrier 11. The active components 13 and 14 may communicate through the region 11$h$1 of the carrier 11. The backside surfaces (e.g., the surfaces 132 and 142) face away from the carrier 11 and may be configured to provide I/O pins for the power paths. For example, power may be output from the surface 141 (as indicated by the power path P1) and power may be input to the surface 131 (as indicated by the power path P1').

The encapsulant 15 may be disposed on the carrier 11 to cover the interconnection structure 12 and the active components 13 and 14. For example, a part of the encapsulant 15 may be disposed between the substrate of the interconnection structure 12 and the active component 13. For example, the conductive element 12$v$ may be surrounded by the substrate of the interconnection structure 12 and the encapsulant 15.

In some embodiments, the encapsulant 15 may also cover an underfill between the interconnection structure 12 and the carrier 11, an underfill between the active component 13 and the carrier 11 and an underfill between the active component 14 and the carrier 11.

In some embodiments, the encapsulant 15 may include an epoxy resin having fillers, a molding compound (e.g., an epoxy molding compound or other molding compound), a polyimide, a phenolic compound or material, a material with a silicone dispersed therein, or a combination thereof.

The carrier 16 may be disposed on the encapsulant 15. The encapsulant 15 may be disposed between the carrier 11 and the carrier 16. As described, the carrier 16 may include an interconnection structure, such as a RDL and/or a grounding element. The RDL may provide a fan-out horizontal electrical path for the devices or components electrically connected with the carrier 16.

In some embodiments, passive components (such as capacitors, inductors, resistors, diodes, fuses or antifuses, etc.) may be integrated into the carrier 16. The passive components may be circuits or circuit elements requiring no an external power source to function and do not provide electrical gain. In some embodiments, the passive components may be present in (be a part of or construct a part of)

the power paths (such as the power paths P1, P1', P2, and P2') between the power regulating devices and the active components.

Alternatively or additionally, in some embodiments, passive components may be integrated into the active component 13. For example, a film capacitor may be disposed on the surface 132 of the active component 13. An electrode of the film capacitor may be electrically connected with the carrier 16 and another electrode of the film capacitor may be electrically connected with the conductive via 13v.

The power regulating device 17 may be disposed on the carrier 16. The power regulating device 17 may be disposed on (or disposed over) the interconnection structure 12 and the active component 13.

The power regulating device 17 may partially overlap with the interconnection structure 12 vertically, or substantially perpendicular to a surface of the carrier 16 on which the power regulating device 17 is disposed. As such, the power path P2 between the power regulating device 17 and the interconnection structure 12 may be substantially perpendicular to a surface of the carrier 16 on which the power regulating device 17 is disposed.

The power regulating device 17 may partially overlap with the active component 13 vertically, or substantially perpendicular to a surface of the carrier 16 on which the power regulating device 17 is disposed. As such, the power path P2' between the power regulating device 17 and the active component 13 may be substantially perpendicular to a surface of the carrier 16 on which the power regulating device 17 is disposed.

The power regulating device 17 may extend over and beyond the lateral surface 133 of the active component 13. The power regulating device 17 may have a connector electrically connected with the active component 13 and another connector electrically connected with the interconnection structure 12.

The power regulating device 17 may be electrically connected with the interconnection structure 12 and the active component 13 through the carrier 16. In some embodiments, the power regulating device 17 may be electrically connected with the carrier 16 through an electrical contact 17e, such as solder balls. In some embodiments, the power regulating device 17 may be electrically connected with the carrier 16 by way of flip-chip or wire-bond techniques.

The power regulating device 17 may be configured to receive power from the interconnection structure 12 (such as from the conductive element 12v) (as indicated by the power path P2), to regulate the power and to provide the regulated power to the active component 13 (as indicated by the power path P2').

The power regulating device 18 may be disposed on the carrier 16. The power regulating device 18 may be disposed on (or disposed over) the active component 13 and the active component 14.

The power regulating device 18 may partially overlap with the active component 14 vertically, or substantially perpendicular to a surface of the carrier 16 on which the power regulating device 18 is disposed. As such, the power path P1 between the power regulating device 18 and the active component 14 may be substantially perpendicular to a surface of the carrier 16 on which the power regulating device 18 is disposed.

The power regulating device 18 may partially overlap with the active component 13 vertically, or substantially perpendicular to a surface of the carrier 16 on which the power regulating device 18 is disposed. As such, the power path P1' between the power regulating device 18 and the active component 13 may be substantially perpendicular to a surface of the carrier 16 on which the power regulating device 18 is disposed.

The power regulating device 18 may extend over and beyond the lateral surface 135 of the active component 13. The power regulating device 18 may have a connector electrically connected with the active component 13 and another connector electrically connected with the active component 14.

The power regulating device 18 may be electrically connected with the active component 13 and the active component 14 through the carrier 16. In some embodiments, the power regulating device 18 may be electrically connected with the carrier 16 through an electrical contact 18e, such as solder balls. In some embodiments, the power regulating device 18 may be electrically connected with the carrier 16 by way of flip-chip or wire-bond techniques.

The power regulating device 18 may be configured to receive power from the active component 14 (such as from the conductive via 14v) (as indicated by the power path P1), to regulate the power and to provide the regulated power to the active component 13 (as indicated by the power path P1').

In some embodiments, the power regulating devices 17 and 18 may each include a power management integrated circuit (PMIC). In some embodiments, the power regulating devices 17 and 18 may each include a voltage regulator, such as a linear regulator (which is configured to maintain a constant output voltage) or a switching regulator (which is configured to generate an output voltage higher than or lower than the input voltage). In some embodiments, the power regulating devices 17 and 18 may each include a step-down (buck) converter, a step-up (boost) converter, an analog-to-digital converter, a digital-to-analog converter, an AC-DC converter, a DC-DC converter, other types of converters, or a combination thereof.

In some embodiments, the active component 13 may include different regions (such as the regions 13r1, 13r2, and 13r3 shown in FIG. 1B) configured to perform different functions, configured to receive different types of power control, and/or configured to receive different voltages of power. The power regulating devices 17 and 18 may be configured to provide different types of power control to the different regions of the active component 13. For example, the power regulating devices 17 and 18 may be configured to provide regulated power to the different regions of the active component 13. For example, the power regulating devices 17 and 18 may be configured to provide different voltages of power to the different regions of the active component 13.

According to some embodiments of the present disclosure, the active components 13 and 14 may be disposed as close as possible to reduce the signal path therebetween, which may be provided, defined, constructed, or established by the region 11h1. In addition, by disposing the power regulating device 18 on the active components 13 and 14, the power paths P1 and P1' may be shorter, voltage drop thereof may be reduced, and supply power for the active component 13 may be lower.

FIG. 1B illustrates a top view of an example of a part of an electronic device according to some embodiments of the present disclosure. In some embodiments, the electronic device 1 in FIG. 1A may have a top view as shown in FIG. 1B. In some embodiments, the electronic device in FIG. 1B along the line A-A' may have a cross-section as shown in FIG. 1A.

The active component 13 may have lateral surfaces (or sides) 133, 134, 135 and 136. One or more interconnection structures (e.g., the interconnection structures 12, 12', 12", and 12'") and one or more active components (e.g., the active components 14 and 14') may be disposed adjacent to the lateral surfaces of the active component 13.

The active component 14 may be disposed adjacent to the lateral surface 135 of the active component 13. The power regulating device 18 may extend over and beyond the lateral surface 135 of the active component 13. The power regulating device 18 may have a connector electrically connected with the active component 13 and another connector electrically connected with the active component 14. The power regulating device 18 may be configured to receive a power from the active component 14 through the power path P1, to regulate the power and to provide the regulated power to the active component 13 through the power path P1'.

The active component 14' may be disposed adjacent to the lateral surface 135 of the active component 13. The power regulating device 18' may extend over and beyond the lateral surface 135 of the active component 13. The power regulating device 18' may have a connector electrically connected with the active component 13 and another connector electrically connected with the active component 14'. The power regulating device 18' may be configured to receive a power from the active component 14' through the power path P5, to regulate the power and to provide the regulated power to the active component 13 through the power path P5'.

Similarly, the interconnection structures 12 and 12' may be disposed adjacent to the lateral surface 133 of the active component 13. The power regulating device 17 may be configured to receive a power from the interconnection structures 12 through the power path P2, to regulate the power and to provide the regulated power to the active component 13 through the power path P2'. The power regulating device 17' may be configured to receive a power from the interconnection structures 12' through the power path P3, to regulate the power and to provide the regulated power to the active component 13 through the power path P3'.

The interconnection structure 12" may be disposed adjacent to the lateral surface 134 of the active component 13. A power regulating device on the interconnection structure 12" may be configured to receive a power from the interconnection structure 12" through the power path P4, to regulate the power and to provide the regulated power to the active component 13 through the power path P4'.

The interconnection structure 12'" may be disposed adjacent to the lateral surface 136 of the active component 13. A power regulating device on the interconnection structure 12'" may be configured to receive a power from the interconnection structure 12'" through the power path P6, to regulate the power and to provide the regulated power to the active component 13 through the power path P6'.

In some embodiments, the power regulating devices (e.g., the power regulating devices 17, 17', 18, and 18') may be disposed around the active component 13 to provide different types of power control (or different voltages of power) to the different regions (such as the regions 13$r$1, 13$r$2, and 13$r$3) of the active component 13. In some embodiments, each of the interconnection structures (e.g., the interconnection structures 12, 12', 12", and 12'") and the active components (e.g., the active components 14 and 14') around the active component 13 may be provided with one power regulating device and forming one power path for the active component 13.

In some embodiments, there may be six power paths constructed or established for the active component 13. The positions and number of the power paths are not intended to limit the present disclosure. For example, there may be any number of the power paths due to design requirements.

FIG. 1B' illustrates a top view of an example of a part of an electronic device according to some embodiments of the present disclosure. The top view in FIG. 1' is similar to the top view in FIG. 1B except that FIG. 1B' shows the region 11$h$1 and the region 11$h$2 of the carrier 11 in FIG. 1A and that some numeral symbols are omitted for clarity and conciseness.

The active components 14 and 14' may be partially disposed over the region 11$h$1. The power regulating devices 18 and 18' may be disposed over the region 11$h$1. The interconnection structures 12, 12', 12", and 12'" may be disposed over the region 11$h$2. The power regulating devices 17 and 17' may be disposed over the region 11$h$2.

Figure 1C:
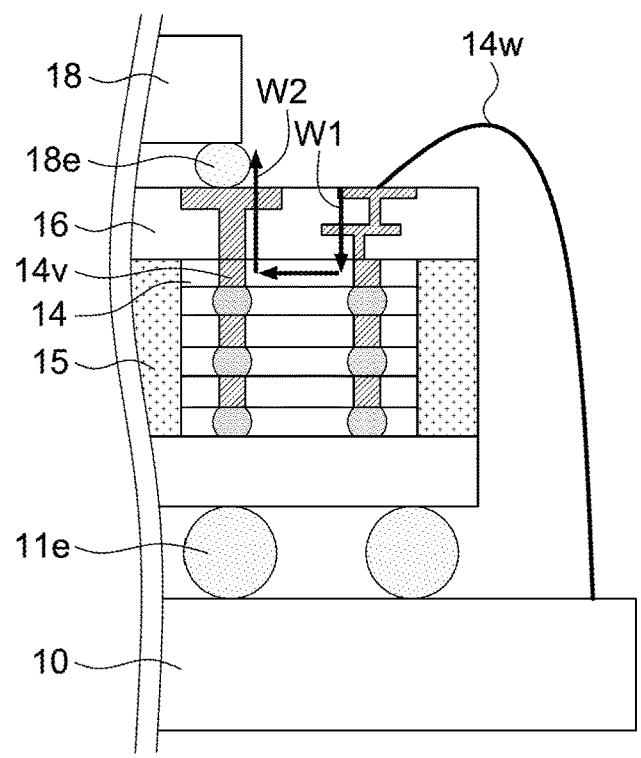
FIG. 1C illustrates a cross-sectional view of an example of a part of an electronic device according to some embodiments of the present disclosure.

FIG. 1C illustrates a cross-sectional view of an example of a part of an electronic device according to some embodiments of the present disclosure. The electronic device in FIG. 1C is similar to the electronic device 1 in FIG. 1A, with differences therebetween as follows.

The active component 14 may include a high bandwidth memory (HBM). The active component 14 may include a stack of memory cells connected through micro bumps. Non-conductive films (or underfill) may be disposed between two of the memory cells to cover the micro bumps. The memory cells may connected with one another through the conductive vias 14$v$ (such as through-silicon-vias (TSVs)). A conductive wire 14$w$ may connect between the carrier 10 and the carrier 16.

The active component 14 may receive a power from the carrier 10, the conductive wire 14$w$, and the carrier 16, as indicated by a power path W1. The active component 14 may transmit the power to the carrier 16, as indicated by a power path W2. Then, the power regulating device 18 may be configured to receive the power from the active component 14 through the power path W2, to regulate the power and to provide the regulated power to the active component 13 shown in FIG. 1A.

In some embodiments, the power may be transmitted through circuit layers in one of the stack of memory cells. In some embodiments, the power may be transmitted through circuit layers in the topmost one of the stack of memory cells. For example, the conductive vias 14$v$ of the topmost memory cell may receive a power from the carrier 16 and the circuit layers of the topmost memory cell may provide a horizontal power path for the power. In some embodiments, the power may be transmitted through circuit layers in any one of the stack of memory cells.

Figure 2A:
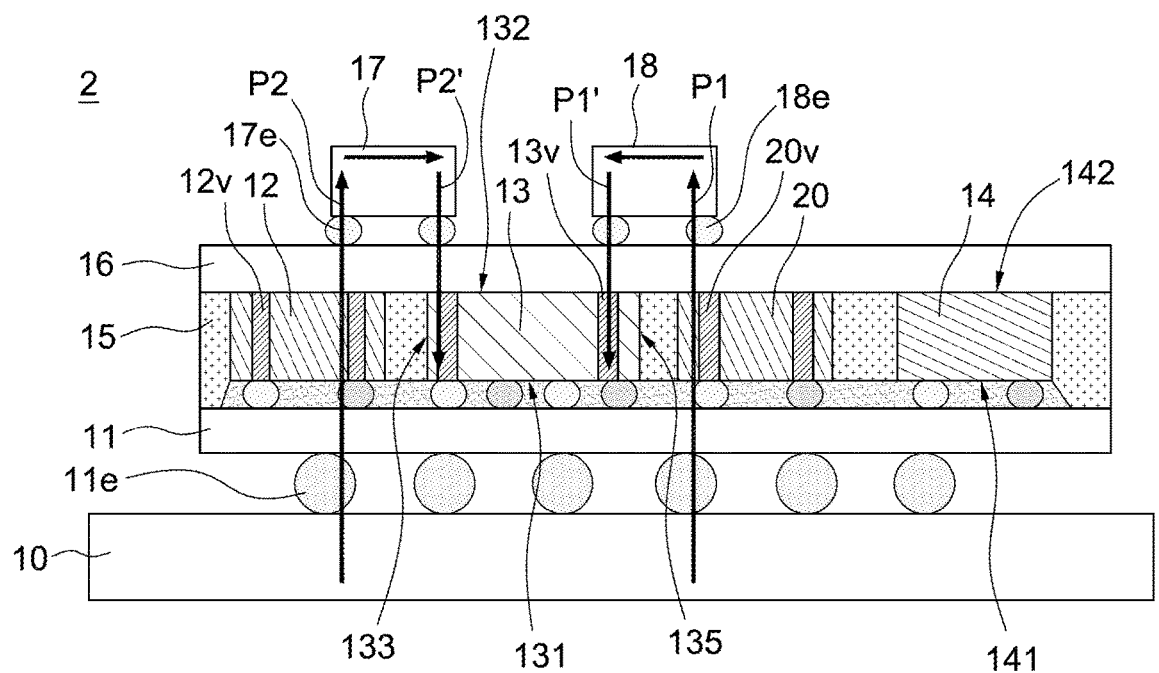
FIG. 2A illustrates a cross-sectional view of an example of an electronic device according to some embodiments of the present disclosure.

FIG. 2A illustrates a cross-sectional view of an example of an electronic device 2 according to some embodiments of the present disclosure. The electronic device 2 is similar to the electronic device 1 in FIG. 1A, with differences therebetween as follows.

The electronic device 2 includes an interconnection structure 20 similar to the interconnection structure 12.

In some embodiments, the interconnection structure 20 may include an interposer or include interposer-like wiring to form a structure which may be regarded as an interposer or a fan-out substrate. For example, the interconnection structure 20 may include a substrate and a conductive element 20$v$ providing electrical connections between the power regulating device 18 and the carrier 11. For example, the conductive element 20$v$ may be configured to receive power from the carrier 11 and transmit the power to the power regulating device 18, as indicated by the power path P1. The conductive element 20v may be configured to transmit power from the carrier 11 to the power regulating device 18 without passing through the active component 13.

The active component 13 may be disposed between the interconnection structure 20 and the interconnection structure 12. The interconnection structure 20 may be disposed between the active component 13 and the active component 14. The active component 14 may be separated from the active component 13 by the interconnection structure 20.

In some other embodiments, the active component 14 may be disposed between the active component 13 and the interconnection structure 20. The interconnection structure 20 may be separated from the active component 13 by the active component 14.

Figure 2B:
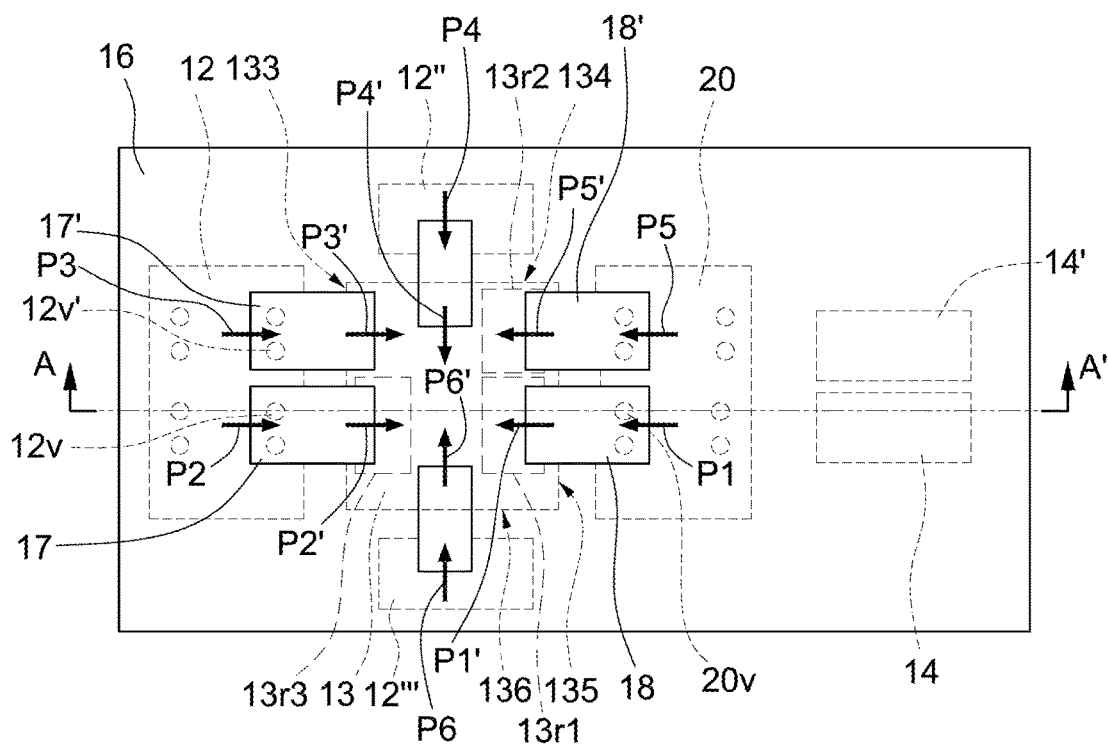
FIG. 2B illustrates a top view of an example of a part of an electronic device according to some embodiments of the present disclosure.

FIG. 2B illustrates a top view of an example of a part of an electronic device according to some embodiments of the present disclosure. In some embodiments, the electronic device 2 in FIG. 2A may have a top view shown in FIG. 2B. In some embodiments, the electronic device in FIG. 2B along the line A-A' may have a cross-section as shown in FIG. 2A.

The interconnection structure 12 may have a plurality of conductive vias (including the conductive elements 12v and 12v') arranged along the surface 133 of the active component 13.

The power regulating devices 17 and 17' may both be disposed on the interconnection structure 12 and the active component 13. The power regulating devices 17 and 17' may both extend over and beyond the lateral surface 133 of the active component 13. The power regulating devices 17 and 17' may use, utilize, or share the same interconnection structure 12 to receive power from the carrier 11. As such, the interconnection structure 12 may be provided with two power regulating devices 17 and 17' and form two power paths P2' and P3' for the active component 13.

The interconnection structure 20 may have a plurality of conductive vias arranged along the surface 135 of the active component 13. The power regulating devices 18 and 18' may both be disposed on the interconnection structure 20 and the active component 13. The interconnection structure 20 may be provided with two power regulating devices 18 and 18' and form two power paths P1' and P5' for the active component 13.

The details of the active components 14 and 14' and the interconnection structures 12" and 12'" may refer to the corresponding paragraphs described with respect to FIG. 1B.

The positions and number of the interconnection structures in the electronic device 2 are not intended to limit the present disclosure. For example, there may be any number of interconnection structures in the electronic device 2 due to design requirements.

Figure 3A:
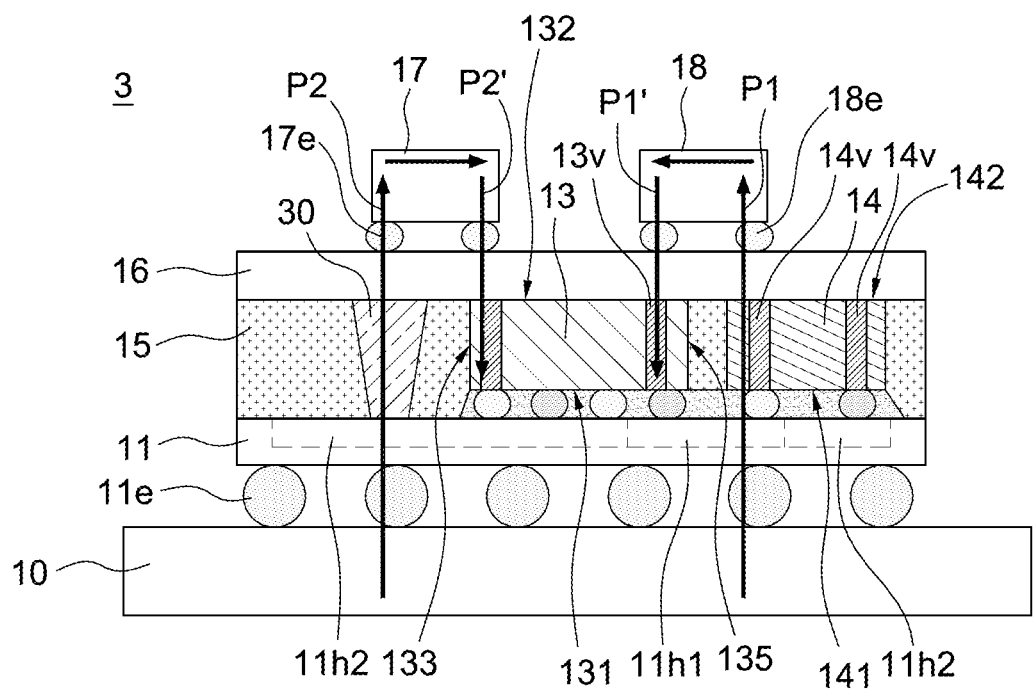
FIG. 3A illustrates a cross-sectional view of an example of an electronic device according to some embodiments of the present disclosure.

FIG. 3A illustrates a cross-sectional view of an example of an electronic device 3 according to some embodiments of the present disclosure. The electronic device 3 is similar to the electronic device 1 in FIG. 1A, with differences therebetween as follows.

The electronic device 3 includes an interconnection structure 30. The interconnection structure 30 may be covered or surrounded by the encapsulant 15.

The interconnection structure 30 may be configured to receive power from the carrier 11 and transmit the power to the power regulating device 17, as indicated by the power path P2. The interconnection structure 30 may be configured to transmit power from the carrier 11 to the power regulating device 17 without passing through the active component 13.

The interconnection structure 30 may include a conductive element, such as a conductive pillar, a conductive via (such as a through-silicon via (TSV)), a conductive trace, a conductive wire, or other feasible connectors.

Figure 3B:
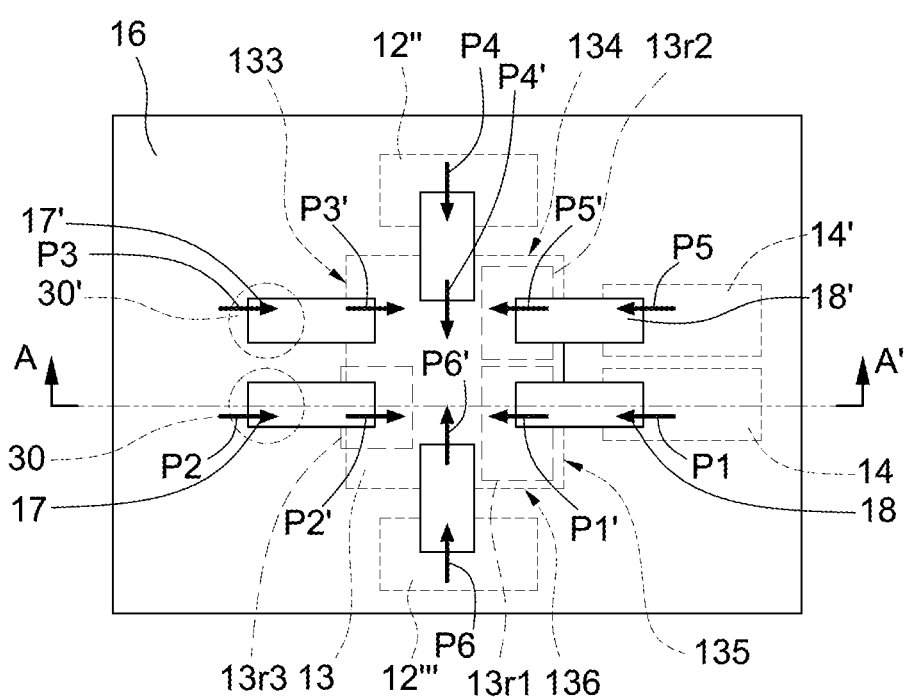
FIG. 3B illustrates a top view of an example of a part of an electronic device according to some embodiments of the present disclosure.
Figure 3B:
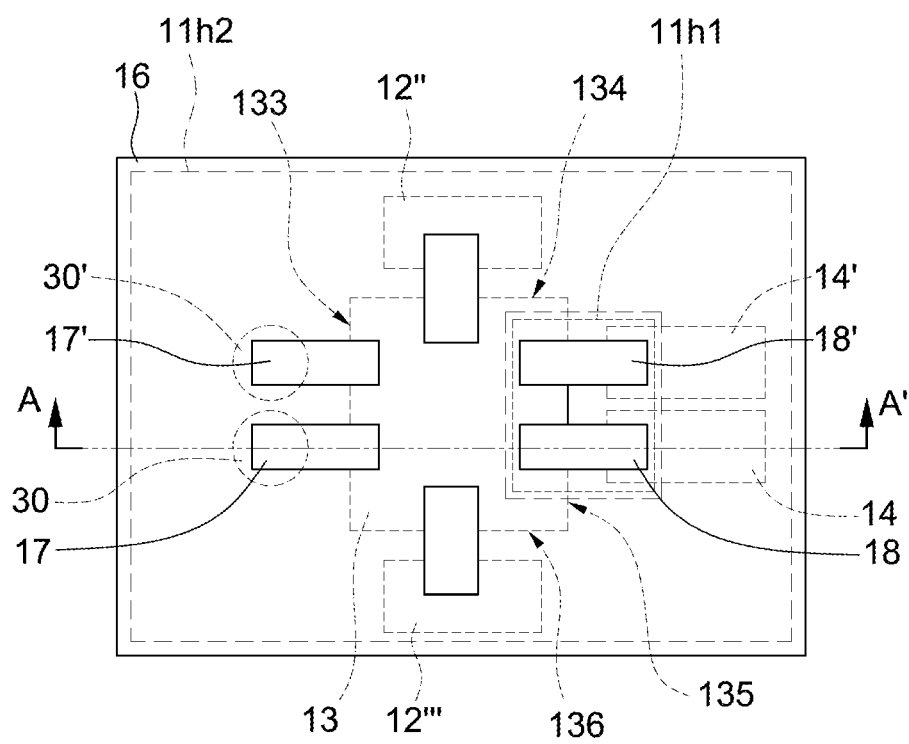

FIG. 3B illustrates a top view of an example of a part of an electronic device according to some embodiments of the present disclosure. In some embodiments, the electronic device 3 in FIG. 3A may have a top view as shown in FIG. 3B. In some embodiments, the electronic device in FIG. 3B along the line A-A' may have a cross-section as shown in FIG. 3A.

One or more interconnection structures (e.g., the interconnection structures 30 and 30') may be disposed adjacent to the lateral surfaces of the active component 13.

For example, the interconnection structures 30 and 30' may be disposed adjacent to the lateral surface 133 of the active component 13. The power regulating device 17 may extend over and beyond the lateral surface 133 of the active component 13. The power regulating device 17 may have a connector electrically connected with the active component 13 and another connector electrically connected with the interconnection structure 30. The power regulating device 17 may be configured to receive a power from the interconnection structures 30 through the power path P2, to regulate the power and to provide the regulated power to the active component 13 through the power path P2'.

The power regulating device 17' may extend over and beyond the lateral surface 133 of the active component 13. The power regulating device 17' may have a connector electrically connected with the active component 13 and another connector electrically connected with the interconnection structure 30'. The power regulating device 17' may be configured to receive a power from the interconnection structures 30' through the power path P3, to regulate the power and to provide the regulated power to the active component 13 through the power path P3'.

In some embodiments, each of the interconnection structures (e.g., the interconnection structures 30 and 30') and the active components (e.g., the active components 14 and 14') around the active component 13 may be provided with one power regulating device and forming one power path for the active component 13.

The details of the active components 14 and 14' and the interconnection structures 12" and 12'" may refer to the corresponding paragraphs described with respect to FIG. 1B.

FIG. 3B' illustrates a top view of an example of a part of an electronic device according to some embodiments of the present disclosure. The top view in FIG. 3B' is similar to the top view in FIG. 3B except that FIG. 3B' shows the region 11h1 and the region 11h2 of the carrier 11 in FIG. 3A and that some numeral symbols are omitted for clarity and conciseness.

The active components 14 and 14' may be partially disposed over the region 11h1. The power regulating devices 18 and 18' may be disposed over the region 11h1. The interconnection structures 30, 30', 12", and 12'" may be disposed over the region 11h2. The power regulating devices 17 and 17' may be disposed over the region 11h2.

Figure 3C:
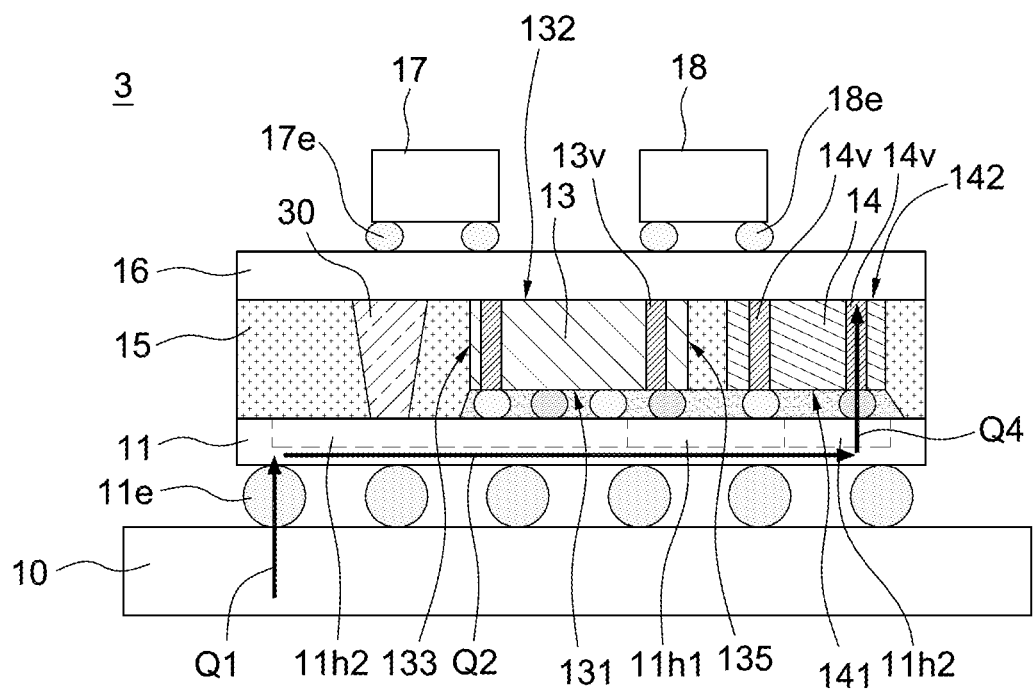
FIG. 3C illustrates a cross-sectional view of an example of an electronic device according to some embodiments of the present disclosure.
Figure 3D:
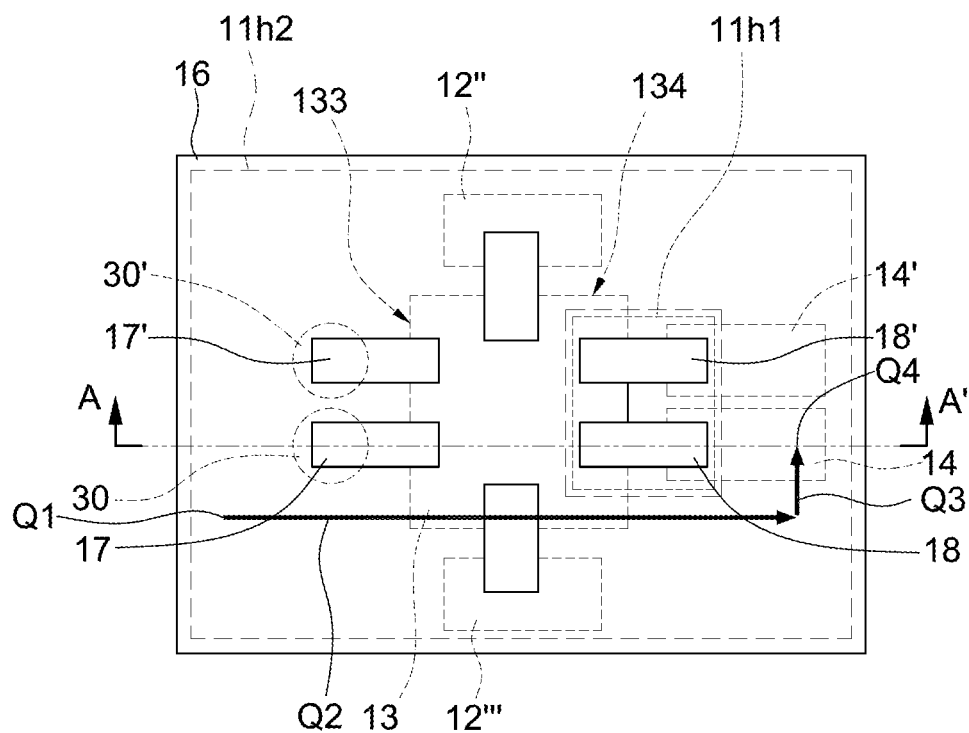
FIG. 3D illustrates a top view of an example of a part of an electronic device according to some embodiments of the present disclosure.

FIGS. 3C and 3D illustrate power paths Q1, Q2, Q3, and Q4 for transmitting a power signal to the active component 14. FIGS. 3C and 3D are similar to FIGS. 3A and 3B and some numeral symbols are omitted for clarity and conciseness.

The power path Q1 may extend vertically from the carrier 10 to the carrier 11. For example, the power path Q1 may pass through the leftmost one of the electrical contacts 11e. The power path Q2 may connect with the power path Q1 and extend horizontally within the carrier 11. The power path Q3 may connect with the power path Q2 and extend horizontally within the carrier 11. The power path Q3 and the power path Q2 may have different orientations. The power path Q3 and the power path Q2 may not pass through the region 11$h$1. The power path Q3 and the power path Q2 may pass around the region 11$h$1. The power path Q4 may connect with the power path Q3 and extend vertically from the carrier 11 to the active component 14.

In some embodiments, the power path Q2 may be omitted. For example, the power path Q1 may pass through the rightmost one of the electrical contacts 11$e$. For example, the power path Q3 may connect with the power path Q1 and extend horizontally within the carrier 11. In some other embodiments, the power path Q1 may pass through any one of the electrical contacts 11$e$.

FIGS. 4A, 4B, 4C and 4D illustrate cross-sectional views in one or more stages of a method of manufacturing an electronic device in accordance with an embodiment of the present disclosure. In some embodiments, the electronic device 1 may be manufactured through the operations described with respect to FIGS. 4A, 4B, 4C and 4D.

Figure 4A:
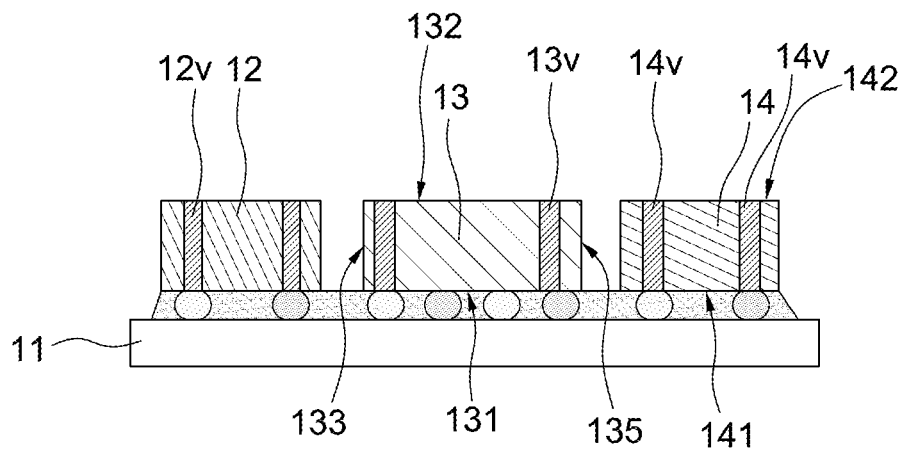
FIGS. 4A, 4B, 4C and 4D illustrate cross-sectional views in one or more stages of a method of manufacturing an electronic device in accordance with an embodiment of the present disclosure.

Referring to FIG. 4A, the carrier 11 is provided. The interconnection structure 12 and the active components 13, 14 are provided on the carrier 11. In some embodiments, the active components 13 and 14 are face-down on the carrier 11.

Figure 4B:
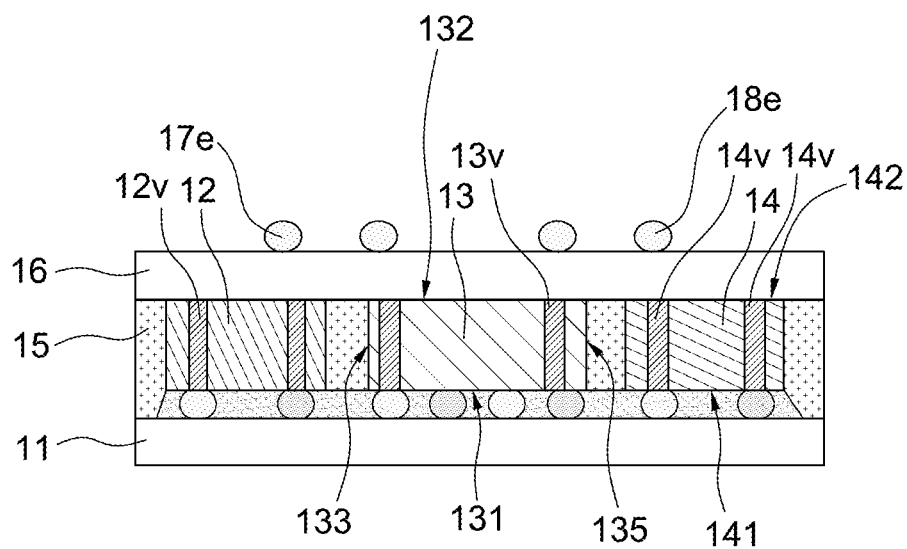

Referring to FIG. 4B, the encapsulant 15 is disposed on the carrier 11 to cover the interconnection structure 12 and the active components 13, 14. In some embodiments, the encapsulant 15 may be formed by molding, such as by transfer molding or compression molding.

In some embodiments, a grinding operation may be performed to remove a portion of the encapsulant 15. The grinding operation may be an abrasive machining process that uses a grinding wheel or grinder. After the grinding operation, the top surfaces of the interconnection structure 12 and the active components 13, 14 may be exposed.

Then, the carrier 16 is formed on the encapsulant 15. The carrier 16 is electrically connected to the interconnection structure 12 and the active components 13, 14. One or more electrical contacts 17$e$ and 18$e$ are disposed on the carrier 16 and electrically connected to the carrier 16.

Figure 4C:
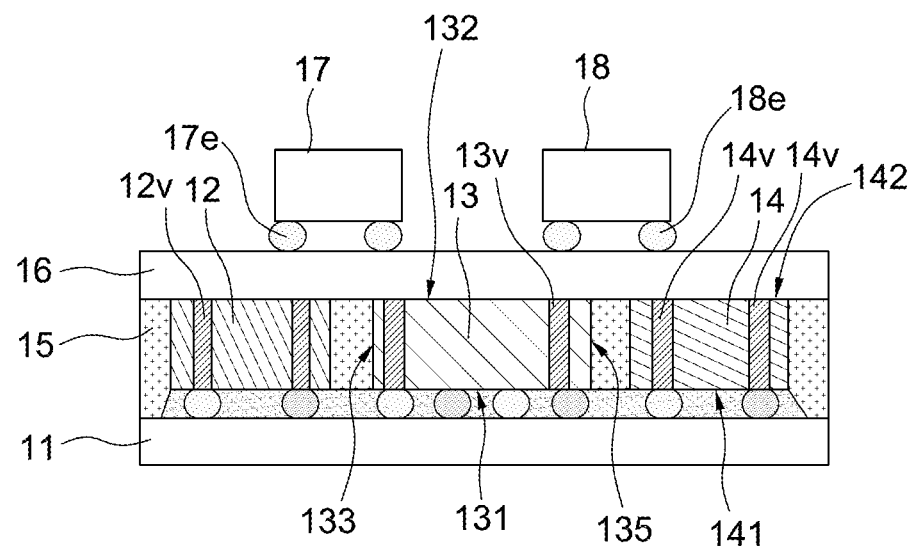

Referring to FIG. 4C, the power regulating device 17 is disposed on the carrier 16 and electrically connected to the carrier 16 through the electrical contact 17$e$. The power regulating device 18 is disposed on the carrier 16 and electrically connected to the carrier 16 through the electrical contact 18$e$.

Figure 4D:
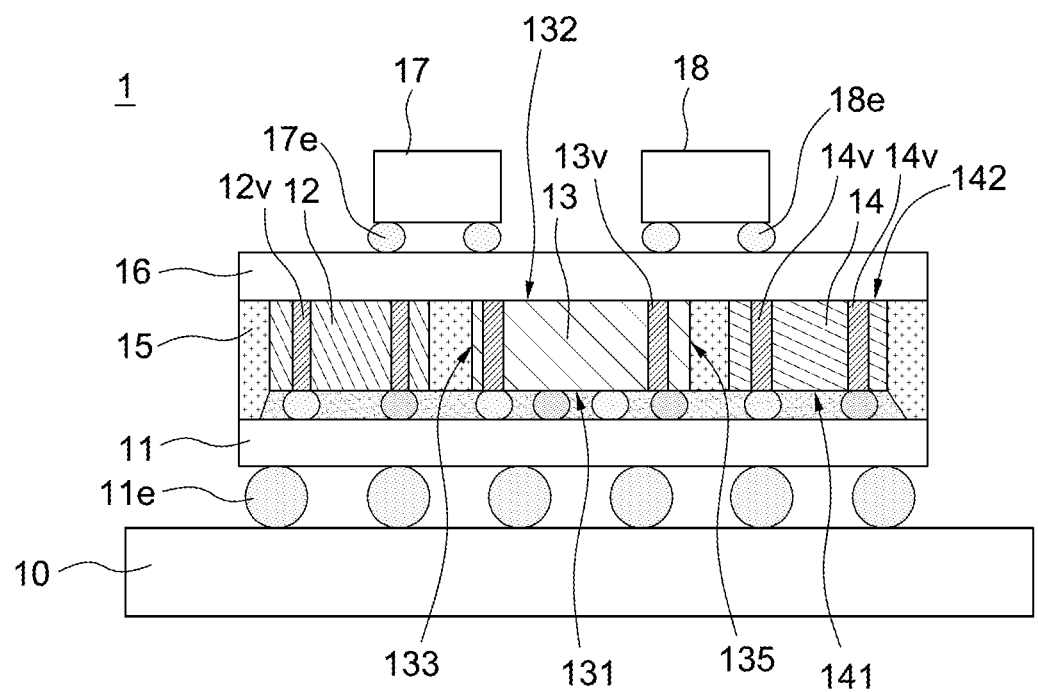

Referring to FIG. 4D, the structure from FIG. 4C is disposed on the carrier 10 and electrically connected to the carrier 10 through the electrical contact 11$e$.

FIGS. 5A, 5B, 5C and 5D illustrate cross-sectional views in one or more stages of a method of manufacturing an electronic device in accordance with an embodiment of the present disclosure. In some embodiments, the electronic device 2 may be manufactured through the operations described with respect to FIGS. 5A, 5B, 5C and 5D.

Figure 5A:
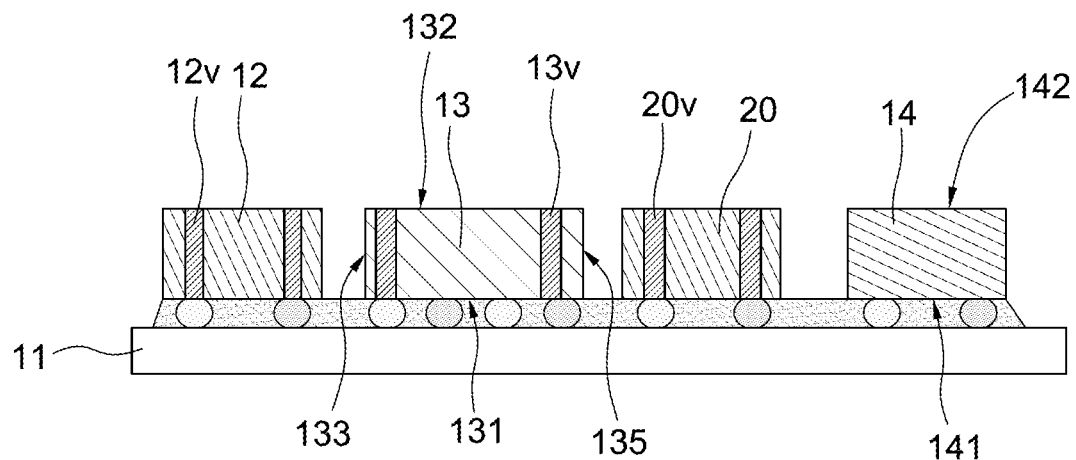
FIGS. 5A, 5B, 5C and 5D illustrate cross-sectional views in one or more stages of a method of manufacturing an electronic device in accordance with an embodiment of the present disclosure.

Referring to FIG. 5A, the carrier 11 is provided. The interconnection structures 12, 20 and the active components 13, 14 are provided on the carrier 11. In some embodiments, the active components 13 and 14 are face-down on the carrier 11.

Figure 5B:
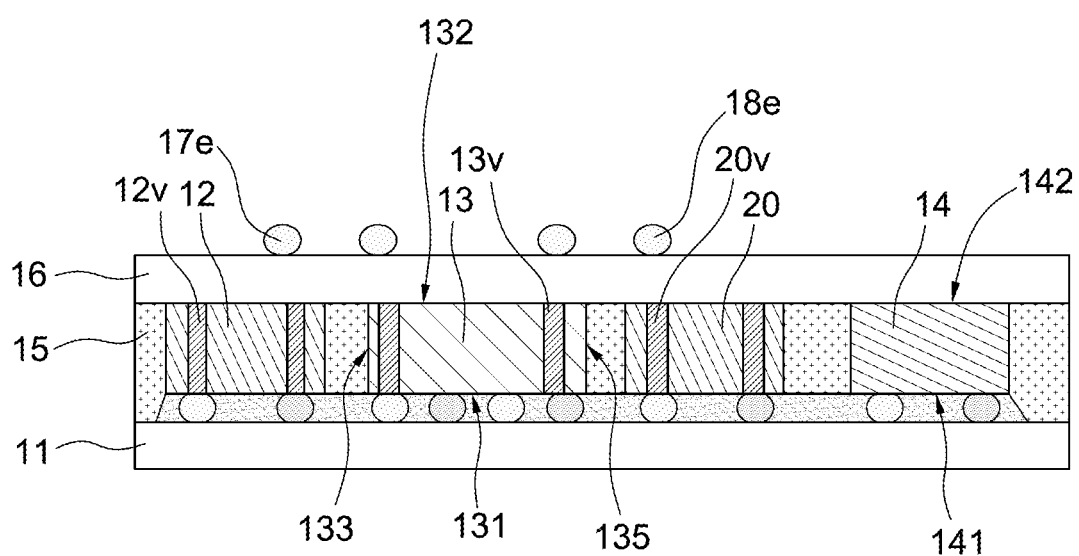

Referring to FIG. 5B, the encapsulant 15 is disposed on the carrier 11 to cover the interconnection structures 12, 20 and the active components 13, 14. In some embodiments, the encapsulant 15 may be formed by molding, such as by transfer molding or compression molding.

In some embodiments, a grinding operation may be performed to remove a portion of the encapsulant 15. The grinding operation may be an abrasive machining process that uses a grinding wheel or grinder. After grinding, the top surfaces of the interconnection structures 12, 20 and the active components 13, 14 may be exposed.

Then, the carrier 16 is formed on the encapsulant 15. The carrier 16 is electrically connected to the interconnection structures 12, 20 and the active components 13, 14. One or more electrical contacts 17$e$ and 18$e$ are disposed on the carrier 16 and electrically connected to the carrier 16.

Figure 5C:
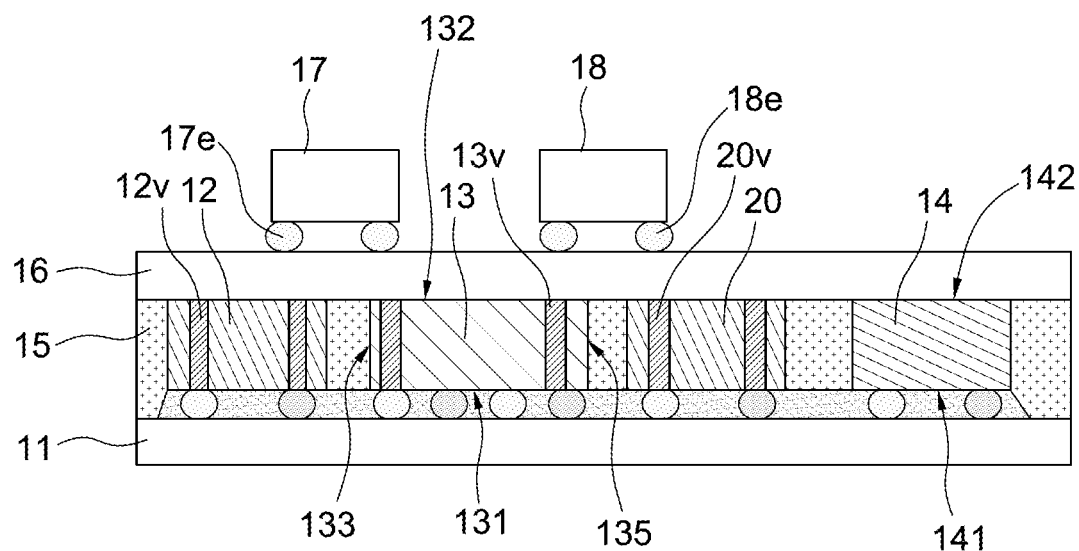

Referring to FIG. 5C, the power regulating device 17 is disposed on the carrier 16 and electrically connected to the carrier 16 through the electrical contact 17$e$. The power regulating device 18 is disposed on the carrier 16 and electrically connected to the carrier 16 through the electrical contact 18$e$.

Figure 5D:
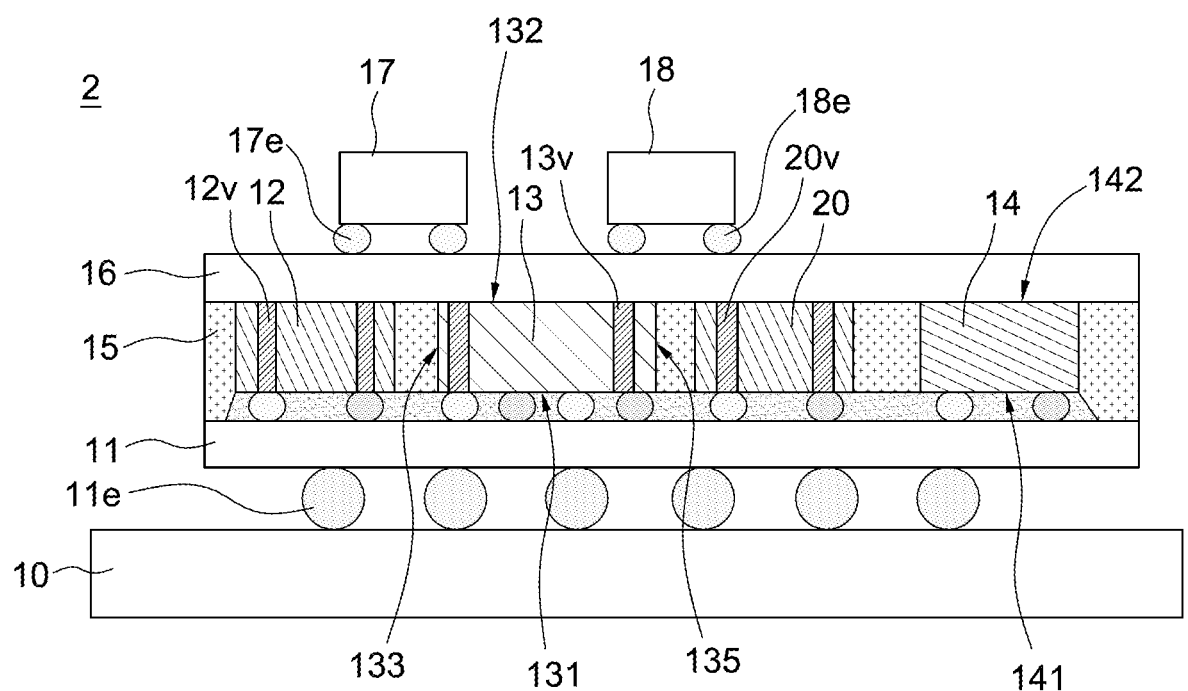

Referring to FIG. 5D, the structure of FIG. 5C is disposed on the carrier 10 and electrically connected to the carrier 10 through the electrical contact 11$e$.

FIGS. 6A, 6B, 6C and 6D illustrate cross-sectional views in one or more stages of a method of manufacturing an electronic device in accordance with an embodiment of the present disclosure. In some embodiments, the electronic device 3 may be manufactured through the operations described with respect to FIGS. 6A, 6B, 6C and 6D.

Figure 6A:
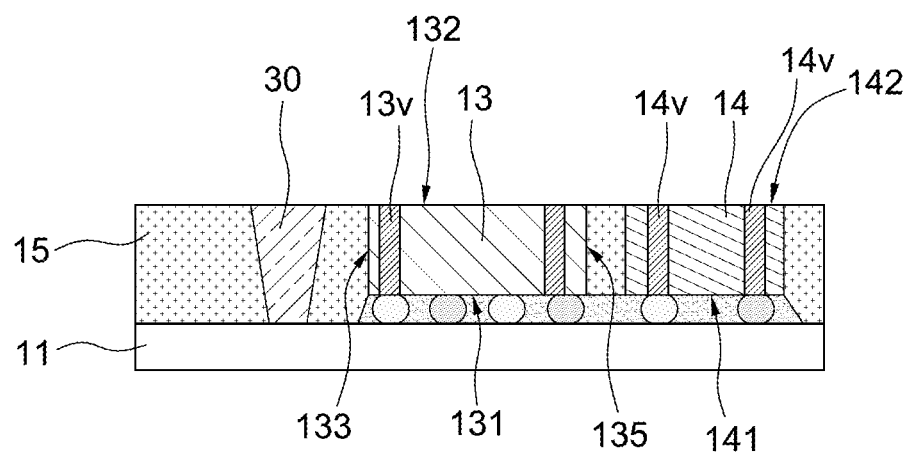
FIGS. 6A, 6B, 6C and 6D illustrate cross-sectional views in one or more stages of a method of manufacturing an electronic device in accordance with an embodiment of the present disclosure.

Referring to FIG. 6A, the carrier 11 is provided. The active components 13 and 14 are provided on the carrier 11. In some embodiments, the active components 13 and 14 are face-down on the carrier 11. The encapsulant 15 is disposed on the carrier 11 to cover the active components 13 and 14. In some embodiments, the encapsulant 15 may be formed by a molding technique, such as transfer molding or compression molding.

In some embodiments, a grinding operation may be performed to remove a portion of the encapsulant 15. The grinding operation may be an abrasive machining process that uses a grinding wheel or grinder. After the grinding operation, the top surfaces of the active components 13 and 14 may be exposed.

Then, a through hole may be form in the encapsulant 15 by, for example, laser drilling. The interconnection structure 30 may be formed by filling the through hole in the encapsulant 15 with a conductive material.

Figure 6B:
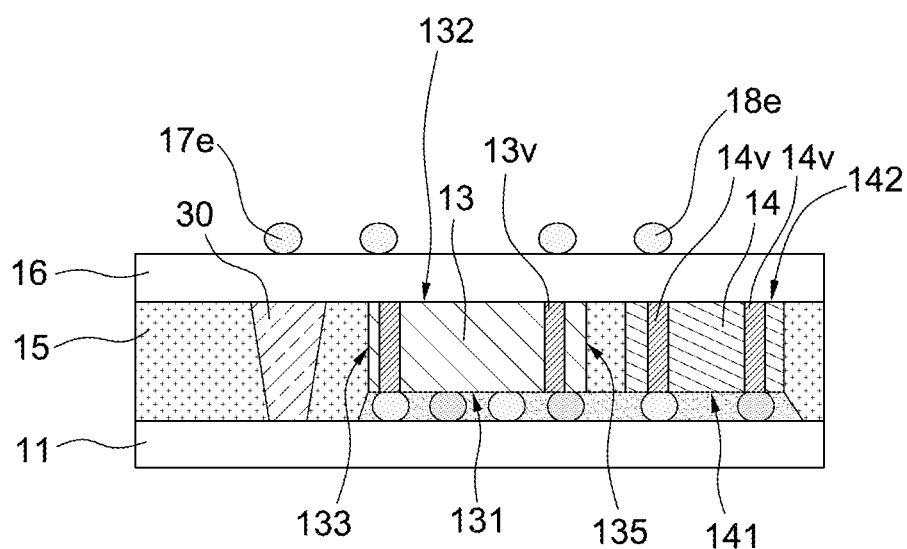

Referring to FIG. 6B, the carrier 16 is formed on the encapsulant 15. The carrier 16 is electrically connected to the interconnection structure 30 and the active components 13, 14. One or more electrical contacts 17$e$ and 18$e$ are disposed on the carrier 16 and electrically connected to the carrier 16.

Figure 6C:
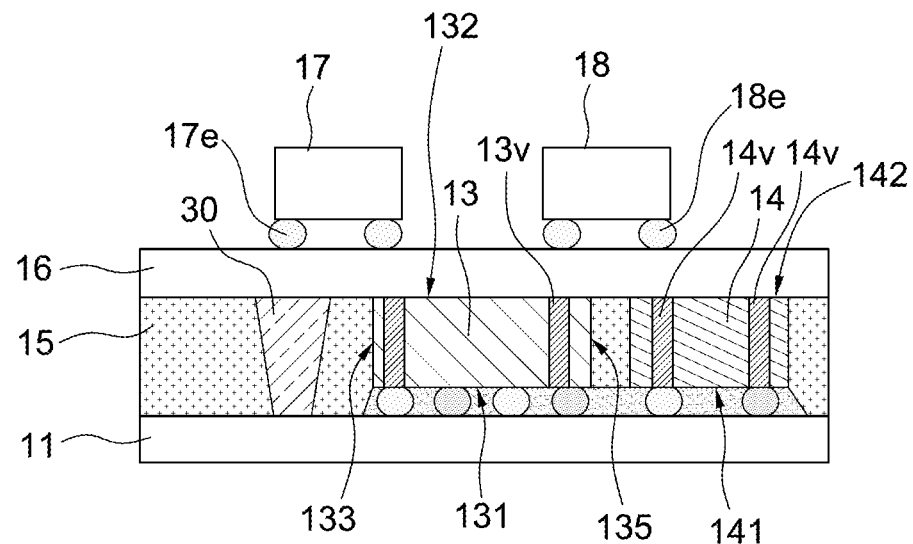

Referring to FIG. 6C, the power regulating device 17 is disposed on and electrically connected to the carrier 16 through the electrical contact 17$e$. The power regulating device 18 is disposed on and electrically connected to the carrier 16 through the electrical contact 18$e$.

Figure 6D:
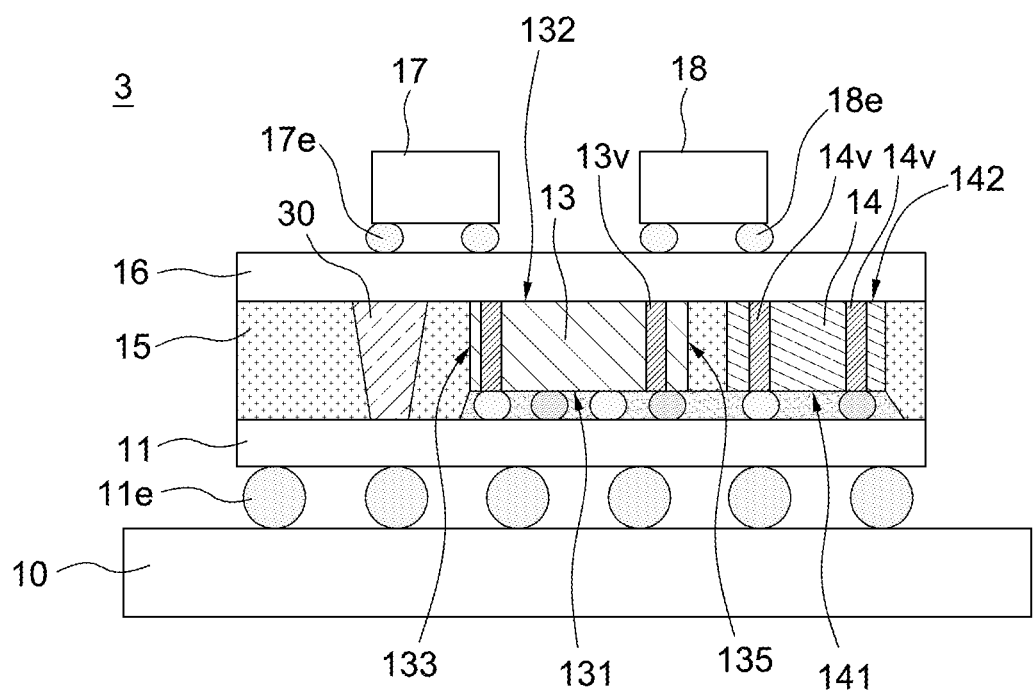

Referring to FIG. 6D, the structure from FIG. 6C is disposed on and electrically connected to the carrier 10 through the electrical contact 11$e$.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to +5%, less than or equal to +4%, less than or equal to +3%, less than or equal to +2%, less than or equal to +1%, less than or equal to ±0.5%, less than or equal to ±0.1%, or less than or equal to ±0.05%. For example, two numerical values can be deemed to be "substantially" the same or equal if a difference between the values is less than or equal to +10% of an average of the values, such as less than or equal to +5%, less than or equal to +4%, less than or equal to +3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a carrier;
a computing element disposed over the carrier; and
a first data storage element disposed over the carrier and electrically connected with the computing element through the carrier,
wherein the computing element is configured to receive a first power provided from the first data storage element.

2. The electronic device of claim 1, wherein the first power is configured to be transmitted through a backside surface of the computing element.

3. The electronic device of claim 2, wherein the first power is configured to be transmitted through a backside surface of the first data storage element.

4. The electronic device of claim 1, further comprising:
a first power regulating device disposed above the computing element and the first data storage element, wherein the first power regulating device is configured to receive the first power from the first data storage element and to provide a second power to the computing element.

5. The electronic device of claim 1, further comprising:
a second data storage element, wherein the computing element comprises a first region and a second region, wherein the first region is configured to receive the first power provided from the first data storage element and the second region is configured to receive a third power provided from the second data storage element.

6. The electronic device of claim 5, further comprising:
a second power regulating device disposed above the computing element and the second data storage element, wherein the second power regulating device is configured to receive the third power from the second data storage element, to regulate the third power to a fourth power, and to provide the fourth power to the second region of the computing element.

7. The electronic device of claim 1, wherein the first data storage element is disposed adjacent to a first side of the computing element, and the electronic device further comprises a conductive element disposed adjacent to a second side of the computing element and configured to provide a second power to the computing element.

8. The electronic device of claim 7, further comprising:
an encapsulant encapsulating the computing element and the first data storage element, wherein the conductive element passes through the encapsulant.

9. The electronic device of claim 7, further comprising:
an interposer disposed adjacent to the second side of the computing element, wherein the conductive element passes through the interposer.

10. The electronic device of claim 7, wherein a voltage of the second power is different from a voltage of the first power.

11. The electronic device of claim 1, wherein:
the carrier has a first region and a second region, and a circuit density in the first region is higher than that in the second region;
the computing element is communicated with the first data storage element through the first region,
and the first data storage element and the computing element are collectively configured to provide a first power path passing through a backside surface of the first data storage element and a backside surface of the computing element.

12. The electronic device of claim 11, further comprising:
a conductive element disposed over the second region of the carrier and adjacent to a first side of the computing element, wherein the conductive element is configured to provide a second power path for the computing element.

13. The electronic device of claim 12, wherein the computing element comprises a first region and a second region, wherein the first region is configured to receive a power from the first power path and the second region is configured to receive a power from the second power path.

14. The electronic device of claim 12, further comprising:
a first interposer disposed over the second region of the carrier, wherein the conductive element passes through the first interposer.

15. The electronic device of claim 11, wherein the first data storage element component is disposed adjacent to a first side of the computing element, and the electronic device further comprises a first interposer disposed adjacent to a second side of the computing element distinct from the first side, wherein the first interposer is configured to provide a second power path for the computing element.

16. The electronic device of claim 15, further comprising:
a second interposer disposed over the second region of the carrier and adjacent to a third side of the computing element, wherein the second interposer is configured to provide a third power path for the computing element.

17. The electronic device of claim 1, wherein:
the computing element has a first lateral surface and a second lateral surface;
the first data storage element is adjacent to the first lateral surface of the computing element; and
a non-data storage element is closer to the second lateral surface than to the first lateral surface of the computing element,
wherein the computing element is configured to receive a first power from the first data storage element and a second power from the non-data storage element.

18. The electronic device of claim 17, wherein the non-data storage element comprises:
a first interposer adjacent to the second lateral surface of the computing element; and
a second interposer adjacent to a third lateral surface of the computing element,
wherein the first interposer and the computing element are configured to constitute a first power path, and the second interposer and the computing element are configured to constitute a second power path, and
wherein the first power path and the second power path are configured to provide powers of different voltages.

19. The electronic device of claim 17, wherein the non-data storage element and the computing element are configured to constitute a third power path and a fourth power path, wherein the third power path and the fourth power path are configured to provide powers of different voltages.

20. The electronic device of claim 19, further comprising:
a first power regulating device disposed over the non-data storage element and the computing element, wherein the first power regulating device is configured to receive the second power, to regulate the second power to a third power, and to provide the third power to the computing element; and
a second power regulating device disposed over the non-data storage element and the computing element, wherein the second power regulating device is configured to receive a fourth power, to regulate the fourth power to a fifth power, and to provide the fifth power to the computing element.

* * * * *